United States Patent
Wang et al.

(10) Patent No.: US 9,368,500 B2
(45) Date of Patent: Jun. 14, 2016

(54) COMPLEMENTARY METAL-OXIDE-SEMICONDUCTOR DEVICE

(71) Applicant: UNITED MICROELECTRONICS CORP., Hsin-Chu (TW)

(72) Inventors: Chang-Tzu Wang, Taoyuan County (TW); Yu-Chun Chen, Hsinchu County (TW); Tien-Hao Tang, Hsinchu (TW); Kuan-Cheng Su, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 178 days.

(21) Appl. No.: 14/071,670

(22) Filed: Nov. 5, 2013

(65) Prior Publication Data
US 2015/0123184 A1    May 7, 2015

(51) Int. Cl.
| H01L 27/092 | (2006.01) |
| H01L 29/78 | (2006.01) |
| H01L 27/06 | (2006.01) |
| H01L 27/02 | (2006.01) |
| H01L 21/8238 | (2006.01) |

(52) U.S. Cl.
CPC ........ *H01L 27/0925* (2013.01); *H01L 27/0274* (2013.01); *H01L 27/0629* (2013.01); *H01L 29/785* (2013.01); *H01L 21/823892* (2013.01); *H01L 27/092* (2013.01)

(58) Field of Classification Search
CPC ............... H01L 21/823814; H01L 21/823807; H01L 27/0262; H01L 21/823842; H01L 27/0922; H01L 21/8249; H01L 27/0251; G11C 16/0433

USPC .......... 257/355, E21.634, E21.633, 369, 173, 257/E21.696, E27.064; 438/199, 231, 238, 438/301
See application file for complete search history.

(56) References Cited

U.S. PATENT DOCUMENTS

| 5,576,557 A * | 11/1996 | Ker ..................... H01L 27/0259 257/141 |
| 6,028,789 A * | 2/2000 | Mehta ................. G11C 16/0441 257/318 |
| 6,072,219 A * | 6/2000 | Ker ........................ H01L 27/088 257/354 |
| 2007/0121381 A1* | 5/2007 | Kalnitsky ........... G11C 16/0433 365/185.18 |
| 2010/0066438 A1* | 3/2010 | Siprak ................... H01L 21/761 327/535 |
| 2012/0170160 A1* | 7/2012 | Wang .................. H01L 27/0262 361/56 |

* cited by examiner

*Primary Examiner* — David Vu
*Assistant Examiner* — Jonathan Han
(74) *Attorney, Agent, or Firm* — Winston Hsu; Scott Margo

(57) ABSTRACT

A CMOS device includes a substrate, a pMOS transistor and an nMOS transistor formed on the substrate, and a gated diode. The gated diode includes a floating gate formed on the substrate in between the pMOS transistor and the nMOS transistor and a pair of a p-doped region and an n-doped region formed in the substrate and between the pMOS transistor and the nMOS transistor. The n-doped region is formed between the floating gate and the nMOS transistor, and the p-doped region is formed between the floating gate and the pMOS transistor.

16 Claims, 10 Drawing Sheets

US 9,368,500 B2

COMPLEMENTARY METAL-OXIDE-SEMICONDUCTOR DEVICE

BACKGROUND OF THE INVENTION

1. Field of the Invention

The invention relates to a complementary metal-oxide-semiconductor (hereinafter abbreviated as CMOS) device, and more particularly, to an electrostatic discharge (hereinafter abbreviated as ESD) protection CMOS device.

2. Description of the Prior Art

Chips and/or Integrated circuits (ICs) are the most essential hardware foundation of the modern information society. As products based on ICs become more and more delicate, they also become more and more vulnerable to the impacts from external environment. For example, it is found that ESD is a constant threat to modern electronics. The result of ESD on unprotected ICs is often destruction, characterized by melting or explosion of a part of the ICs. Therefore, the ESD protection devices are taken as important components of the protection circuitry provided in today's electronic devices.

However, conventional ESD protection circuits may be prone to latch-up. Latch-up is the creation of an undesirable current path between rails, such as $V_{DD}$ and ground, which causes large amounts of current to be drawn from the power supply. In particular, latch-up is known to be initiated by an equivalent circuit of a cross-coupled. Latch-up may cause circuit malfunction and/or irreversible damage to the ICs. As a countermeasure against to the problems, there have been proposed the donut-shaped guard ring to avoid latch-up occurrence. Also, a higher holding voltage is required for reducing latch-up risk.

With the scaling of standard CMOS technology, the spacing of the p+/n+ space decreases, leading to a lower trigger condition and easy onset of CMOS latch-up. To overcome this disadvantage, the width of the guard rings is usually increased or the amount of the guard ring is doubled at the expense of circuit packing density. Therefore, a semiconductor device, particularly the ESD protection semiconductor device, with a simple guard ring and high holding voltage for providing sufficient latch-up avoidance resulting in smaller and more densely packed chip devices is still in need.

SUMMARY OF THE INVENTION

According to an aspect of the present invention, a CMOS device is provided. The CMOS device includes a substrate, a pMOS transistor and an nMOS transistor formed on the substrate, and a gated diode. The gated diode includes a floating gate formed on the substrate in between the pMOS transistor and the nMOS transistor and a pair of a p-doped region and an n-doped region formed in the substrate and between the pMOS transistor and the nMOS transistor. The n-doped region is formed between the floating gate and the nMOS transistor, and the p-doped region is formed between the floating gate and the pMOS transistor.

According to the CMOS device provided by the present invention, a gated diode is provided to separate the pMOS transistor and the nMOS transistor. More important, the gated diode is provided to increase the holding voltage of the CMOS transistor by adding P/N junctions between the pMOS transistor and the nMOS transistor. Briefly speaking, the CMOS device provided by the present invention improves latch-up immunity without increasing layout area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
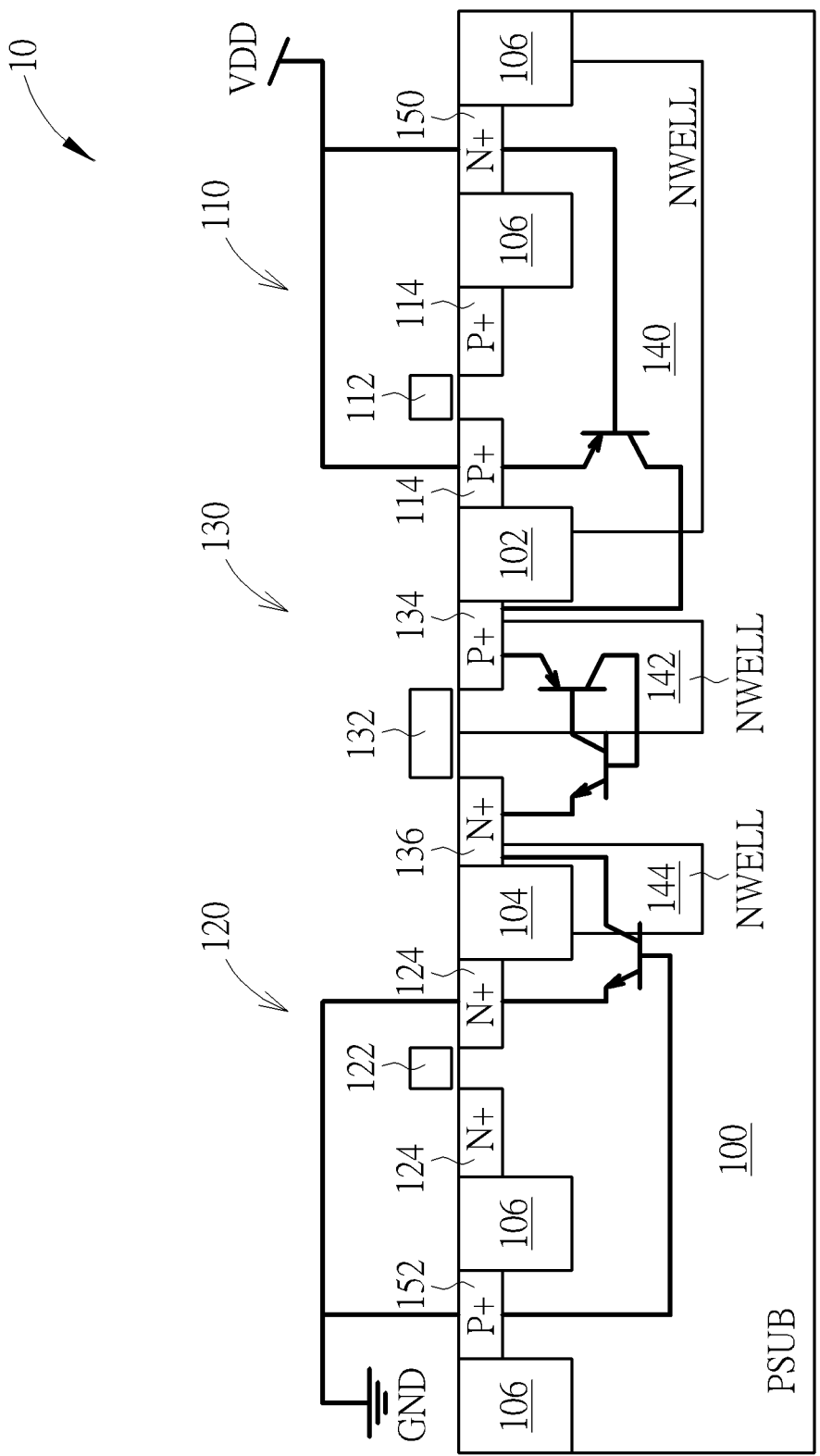
FIG. 1 is a schematic drawing illustrating a cross-sectional view of a CMOS device provided by a first preferred embodiment of the present invention.

Please refer to FIG. 1, which is a schematic drawing illustrating a cross-sectional view of a CMOS device provided by a first preferred embodiment of the present invention. According to the first preferred embodiment, a CMOS device 10 is provided. The CMOS device 10 includes a p-typed substrate 100, therefore it can be taken as a p-substrate 100 or a PSUB 100. A pMOS transistor 110, an nMOS transistor 120, and a gated diode 130 are formed on the substrate 100. As shown in FIG. 1, the pMOS transistor 110 includes a p-gate 112 and a p-source/drain 114, and the nMOS transistor 120 includes an n-gate 122 and an n-source/drain 124. It should be noted that the pMOS transistor 110 and the nMOS transistor 120 further include lightly-doped drains (LDDs) of their own conductivity type. And a spacer is respectively formed on sidewalls of the p-gate 112 and the n-gate 122. Though the LDDs and the spacers are omitted from FIG. 1, those skilled in the art would easily realize the placement of those elements.

As shown in FIG. 1. The gated diode 130 of the CMOS device 10 further includes a floating gate 132 formed on the substrate 100 in between the pMOS transistor 110 and the nMOS transistor 120, and a pair of a p-doped region 134 and an n-doped region 136 formed in the substrate 100 and between the pMOS transistor 110 and the nMOS transistor 120. More specific, the p-doped region 134 is formed between the floating gate 132 and the pMOS transistor 110, and the n-doped region 136 is formed between the floating gate 132 and the nMOS transistor 120. Furthermore, a first isolation structure 102 is formed in the substrate 100 between the p-doped region 134 and the pMOS transistor 110, and a second isolation structure 104 is formed in the substrate 100 between the n-doped region 136 and the nMOS transistor 120. Accordingly, the gated diode 130 is formed between the pMOS transistor 110 and the nMOS transistor 120, and spaced apart from the pMOS transistor 110 and the nMOS transistor 120 by the first isolation structure 102 and the second isolation structure 104. Additionally, the pMOS transistor 110 and the nMOS transistor 120 are electrically isolated from other devices by another isolation structures 106 formed in the substrate 100 as shown in FIG. 1.

Please still refer to FIG. 1. The CMOS device 10 further includes a first n-well 140 formed in the substrate 100, and the pMOS transistor 110 is formed in the first n-well 140. Compared with the pMOS transistor 110 which is formed in the first n-well 140, the nMOS transistor 120 is formed in the p-substrate 100 as shown in FIG. 1. The CMOS device 10 further includes a second n-well 142 formed in the substrate 100, and the second n-well 142 contacts a bottom and at least a side of the p-doped region 134 and spaced apart from the first n-well 140. The CMOS device 10 further includes a third n-well 144 formed in the substrate 100, and the third n-well 144 contacts a bottom of the n-doped region 136 and spaced apart from the first n-well 140 and from the second n-well 142.

Additionally, a guard ring formed by an n-doped region 150 can be formed around the pMOS transistor 110 except the side where the gated diode 130 is located. Also, a guard ring formed by a p-doped region 152 can be formed around the nMOS transistor 120 except the side where the gated diode 130 is located.

According to the CMOS device 10 provided by the first preferred embodiment, a silicon controlled rectifier (SCR) is formed by the floating gate 132, the p-doped region 134, and the n-doped region 136. The SCR is sandwiched between two bipolar junction transistors (BJTs). One of the BJTs is formed by the p-source/drain 114 of the pMOS transistor 110, the first n-well 140 (and the n-doped region 150) and the p-substrate 100 (and the p-doped region 134), and is resulted in a PNP BJT. Alternatively, the other one is formed by the n-doped region 136 (and the third n-well 144), the p-substrate 100 (and the p-doped region 152) and the n-source/drain 124 of the nMOS transistor 120, and is resulted in an NPN BJT. More specific, the CMOS device 10 of the preferred embodiment provides a current path and thus the current flow from the p-source/drain 114 of the pMOS transistor 110, the first n-well 140, the p-substrate 100, the p-doped region 134 of the gated diode 130, the second n-well 142, the p-substrate 100, the n-doped region 136 of the gated diode 130, the third n-well 144, the p-substrate 100, to the n-source/drain 124 of the nMOS transistor 120. Since the p-source/drain 114 and the p-doped region 134 are heavily doped, it can be taken as a P+ region as shown in FIG. 1. In the same concept, since the n-doped region 136 and the n-source/drain 124 are heavily doped, it can be taken as an N+ region as shown in FIG. 1. Accordingly, the current path is formed as: P+ 114/Nwell 140/PSUB 100-P+ 134/Nwell 142/PSUB 100/N+ 136-Nwell 144/PSUB 100/N+ 124. In other words, a 8-PN current path, which is formed by the abovementioned 8 adjacent p/n regions, is provided. More important, the holding voltage of the CMOS device 10 is increased to 4V due to the 8-PN current path, and therefore the latch-up immunity is improved.

Figure 2:
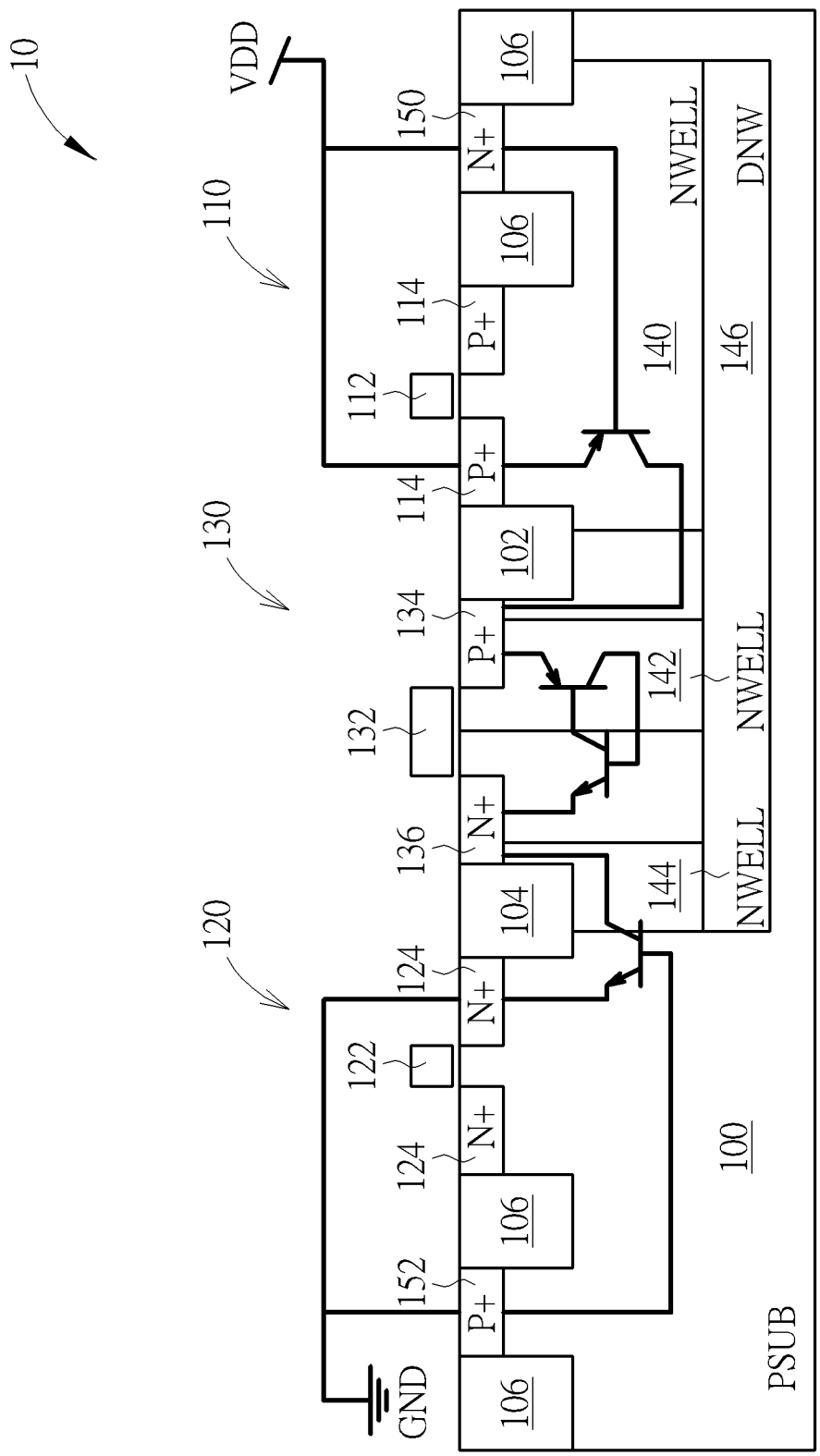
FIG. 2 is a schematic drawing illustrating a modification to the first preferred embodiment.

Please refer to FIG. 2, which is a schematic drawing illustrating a modification to the first preferred embodiment. It is noteworthy that elements the same in the first preferred embodiment and the instant modification are designated by the same numerals and thus those details are omitted in the interest of brevity. The difference between the first preferred embodiment and the instant modification is: The CMOS device 10 provided by the modification further includes a deep n-well 146 formed in the substrate 100. The deep n-well 146 is a band-like region and contacts a bottom of the first n-well 140, a bottom of the second n-well 142, and a bottom of the third n-well 144. Consequently, portions of the p-substrate 100 are encompassed by the deep n-well 146, the first n-well 140, and the second n-well 142, and encompassed by the deep n-well 146, the second n-well 142, and the third n-well 144. As shown in FIG. 2, the deep n-well 146 is aligned with the first n-well 140 and the third n-well 144. In other words, the deep n-well 146 is constrained in regions where the pMOS transistor 110 and the gated diode 130 are located, and not extended to the region under the nMOS transistor 120.

Figure 3:
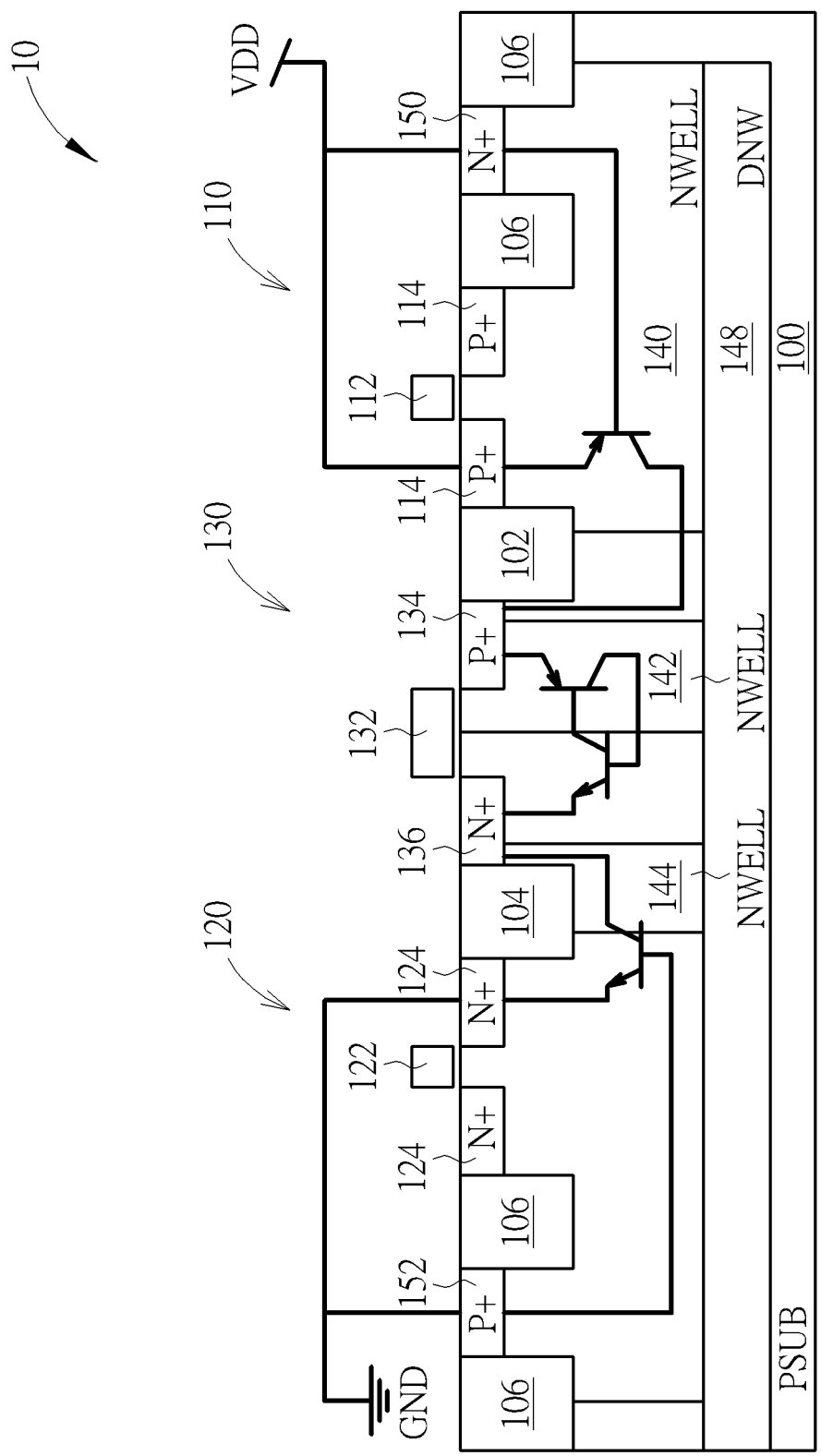
FIG. 3 is a schematic drawing illustrating another modification to the first preferred embodiment.

Please refer to FIG. 3, which is a schematic drawing illustrating another modification to the first preferred embodiment. It is noteworthy that elements the same in the first preferred embodiment and the instant modification are designated by the same numerals and thus those details are omitted in the interest of brevity. The difference between the first preferred embodiment and the instant modification is: The CMOS device 10 provided by the modification further includes a deep n-well 148 formed in the substrate 100. The deep n-well 148 is a band-like region and contacts a bottom of the first n-well 140, a bottom of the second n-well 142, and a bottom of the third n-well 144. More important, the deep n-well 148 is extended to regions under the nMOS transistor 120 as shown in FIG. 3. Consequently, portions of the p-substrate 100 are encompassed by the deep n-well 148, the first n-well 140, and the second n-well 142, encompassed by the deep n-well 148, the second n-well 142, and the third n-well 144, and encompassed by the deep n-well 148 and the third n-well 144.

According to the modifications of the present invention, the deep n-wells 146/148 are provided as a reinforcement structure. It is observed that current is ensured to pass the 8-PN current path due to the deep n-well 146/148. And therefore it is ensured that the holding voltage of the CMOS device 10 being increased to 4V and latch-up immunity being improved due to the 8-PN current path.

Additionally, a silicon-on-insulator (SOI) substrate can be provided so that the CMOS device 10 is formed on the SOI substrate. More important, the insulator can replace the deep n-well 148 so that current is ensured to pass the 8-PN current path due to the insulator.

Figure 4:
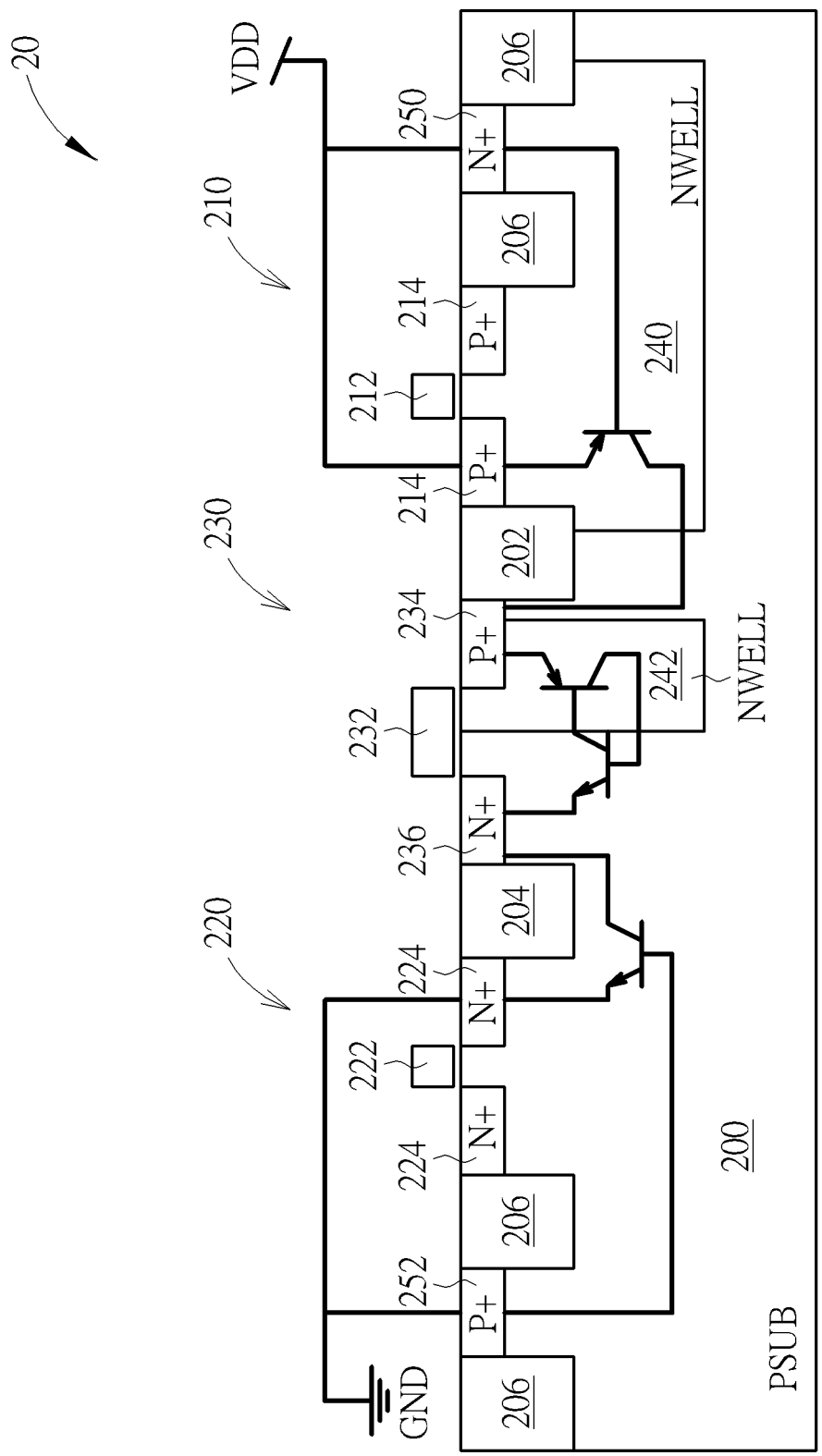
FIG. 4 is a schematic drawing illustrating a cross-sectional view of a CMOS device provided by a second preferred embodiment of the present invention.

Please refer to FIG. 4, which is a schematic drawing illustrating a cross-sectional view of a CMOS device provided by a second preferred embodiment of the present invention. According to the second preferred embodiment, a CMOS device 20 is provided. The CMOS device 20 includes a p-typed substrate 200, it can be taken as a p-substrate 200 or PSUB 200. A pMOS transistor 210, an nMOS transistor 220, and a gated diode 230 are formed on the substrate 200. As shown in FIG. 4, the pMOS transistor 210 includes a p-gate 212 and a p-source/drain 214, and the nMOS transistor 220 includes an n-gate 222 and an n-source/drain 224. As mentioned above, the pMOS transistor 210 and the nMOS transistor 220 further include LDDs and spacers. Though the LDDs and the spacers are omitted from FIG. 4, those skilled in the art would easily realize the placement of those elements.

As shown in FIG. 4. The gated diode 230 of the CMOS device 20 further includes a floating gate 232 formed on the substrate 200 in between the pMOS transistor 210 and the nMOS transistor 220, and a pair of a p-doped region 234 and an n-doped region 236 formed in the substrate 200 and between the pMOS transistor 210 and the nMOS transistor 220. More specific, the p-doped region 234 is formed between the floating gate 232 and the pMOS transistor 210, and the n-doped region 236 is formed between the floating gate 232 and the nMOS transistor 220. Furthermore, a first isolation structure 202 is formed in the substrate 200 between the p-doped region 234 and the pMOS transistor 210, and a second isolation structure 204 is formed in the substrate 200 between the n-doped region 236 and the nMOS transistor 220. Accordingly, the gated diode 230 is formed between the pMOS transistor 210 and the nMOS transistor 220, and spaced apart from the pMOS transistor 210 and the nMOS transistor 220 by the first isolation structure 202 and the second isolation structure 204. Additionally, the pMOS transistor 210 and the nMOS transistor 220 are electrically isolated from other devices by another isolation structures 206 formed in the substrate 200 as shown in FIG. 4.

Please still refer to FIG. 4. The CMOS device 20 further includes a first n-well 240 formed in the substrate 200, and the pMOS transistor 210 is formed in the first n-well 240. Compared with the pMOS transistor 210 which is formed in the first n-well 240, the nMOS transistor 220 is formed in the p-substrate 200 as shown in FIG. 4. The CMOS device 20 further includes a second n-well 242 formed in the substrate 200, and the second n-well 242 contacts a bottom and at least a side of the p-doped region 234 and spaced apart from the first n-well 240.

Additionally, a guard ring formed by an n-doped region 250 can be formed around the pMOS transistor 210 except the side where the gated diode 230 is located. Also, a guard ring formed by a p-doped region 252 can be formed around the nMOS transistor 220 except the side where the gated diode 230 is located.

According to the CMOS device 20 provided by the second preferred embodiment, a SCR is formed by the floating gate 232, the p-doped region 234, and the n-doped region 236. The SCR is sandwiched between two BJTs. One of the BJTs is formed by the p-source/drain 214 of the pMOS transistor 210, the first n-well 240 (and the n-doped region 250), the p-substrate 200 and the p-doped region 234, and is resulted in a PNP BJT. Alternatively, the other one is formed by the n-doped region 236, the p-substrate 200 (and the p-doped region 252) and the n-source/drain 224 of the nMOS transistor 220, and is resulted in an NPN BJT. More specific, the CMOS device 20 of the preferred embodiment provides a current path and thus the current flow from the p-source/drain 214 of the pMOS transistor 210, the first n-well 240, the p-substrate 200, the p-doped region 234 of the gated diode 230, the second n-well 242, the p-substrate 200, the n-doped region 236 of the gated diode 230, the p-substrate 200, to the n-source/drain 224 of the nMOS transistor 220. Accordingly, the current path is formed as: P+ 214/Nwell 240/PSUB 200-P+ 234/Nwell 242/PSUB 200/N+ 236/PSUB 200/N+ 224. In other words, a 8-PN current path, which is formed by the abovementioned 8 adjacent p/n regions, is provided. More important, the holding voltage of the CMOS device 20 is increased to 4V due to the 8-PN current path, and therefore the latch-up immunity is improved.

Figure 5:
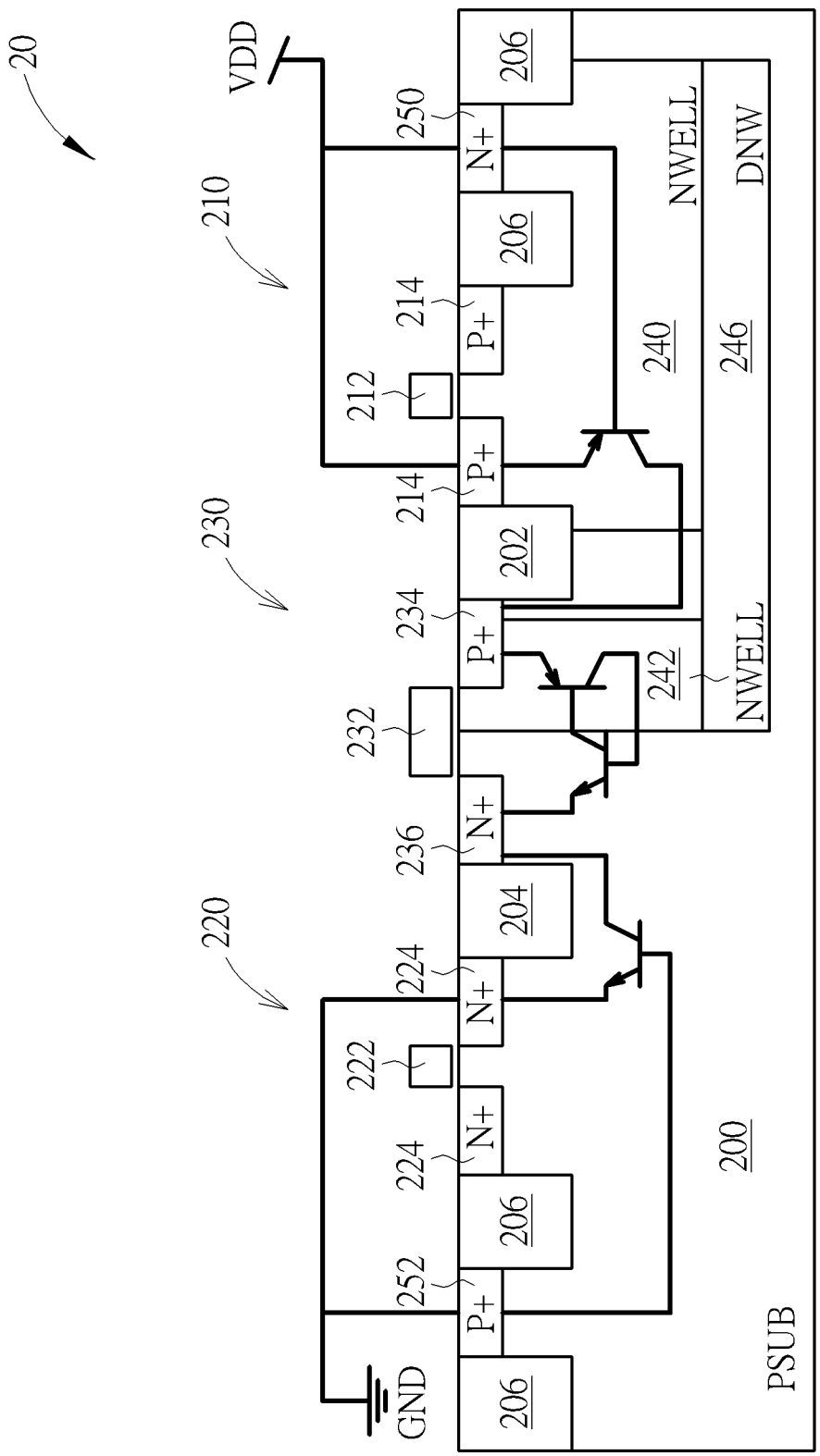
FIG. 5 is a schematic drawing illustrating a modification to the second preferred embodiment.

Please refer to FIG. 5, which is a schematic drawing illustrating a modification to the second preferred embodiment. It is noteworthy that elements the same in the second preferred embodiment and the modification are designated by the same numerals and thus those details are omitted in the interest of brevity. The difference between the second preferred embodiment and the modification is: The CMOS device 20 provided by the modification further includes a deep n-well 246 formed in the substrate 200. The deep n-well 246 is a band-like region and contacts a bottom of the first n-well 240 and a bottom of the second n-well 242. Consequently, portions of the p-substrate 200 are encompassed by the deep n-well 246, the first n-well 240, and the second n-well 242. As shown in FIG. 5, the deep n-well 246 is aligned with the first n-well 240 and the second n-well 242. In other words, the deep n-well 246 is constrained in regions where the pMOS transistor 210 and the p-doped region 234 of the gated diode 230 are located, and not extended to the region under the nMOS transistor 220.

According to the modifications of the present invention, the deep n-wells 246 is provided as a reinforcement structure. It is observed that current is ensured to pass the 8-PN current path due to the deep n-well 246. And therefore it is ensured that the holding voltage of the CMOS device 20 being increased to 4V and latch-up immunity being improved due to the 8-PN current path.

Figure 6:
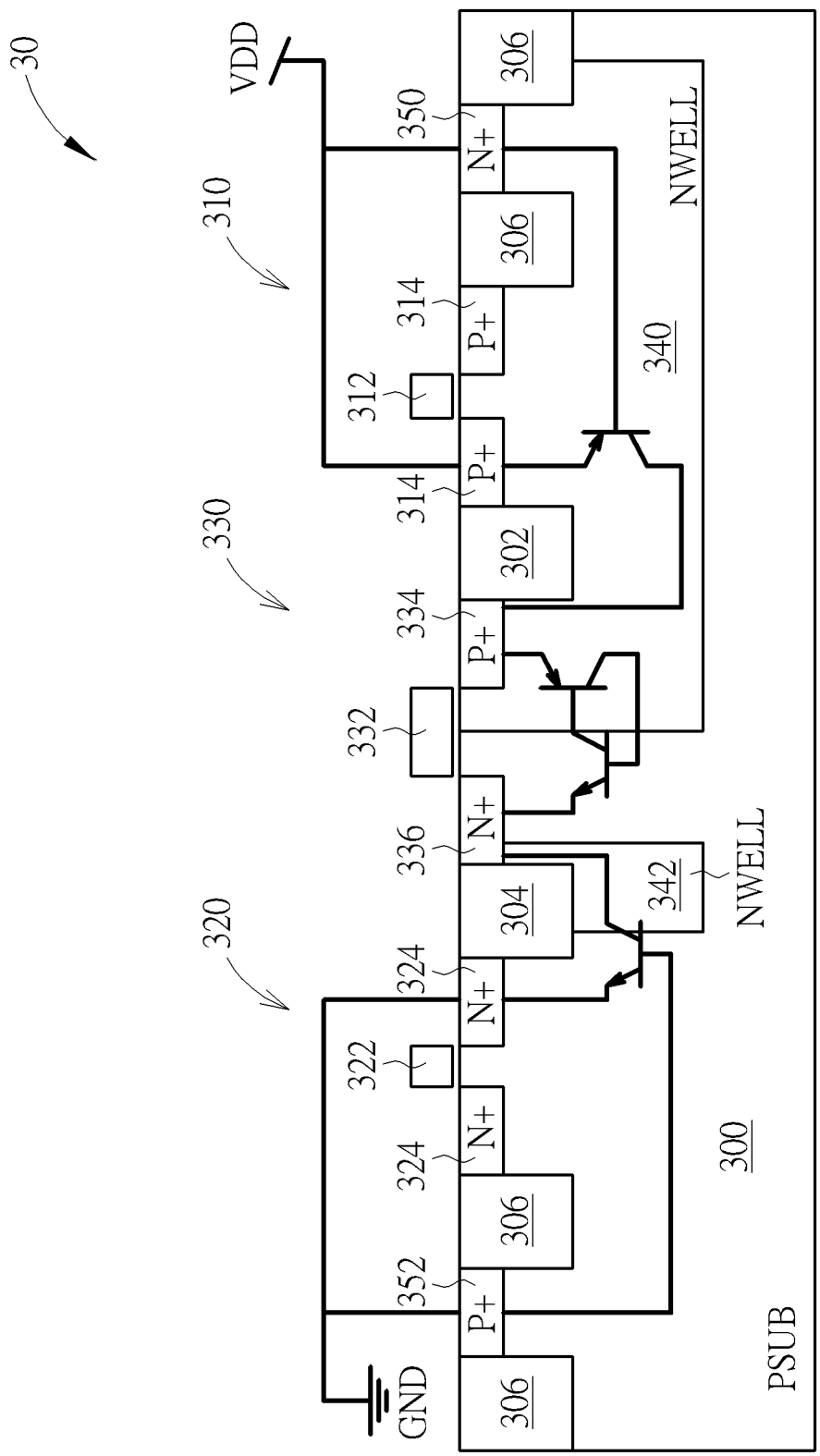
FIG. 6 is a schematic drawing illustrating a cross-sectional view of a CMOS device provided by a third preferred embodiment of the present invention.

Please refer to FIG. 6, which is a schematic drawing illustrating a cross-sectional view of a CMOS device provided by a third preferred embodiment of the present invention. According to the third preferred embodiment, a CMOS device 30 is provided. The CMOS device 30 includes a p-substrate (PSUB) 300. A pMOS transistor 310, an nMOS transistor 320, and a gated diode 330 are formed on the substrate 300. As shown in FIG. 6, the pMOS transistor 310 includes a p-gate 312 and a p-source/drain 314, and the nMOS transistor 320 includes an n-gate 322 and an n-source/drain 324. As mentioned above, the pMOS transistor 310 and the nMOS transistor 320 further include LDDs and spacer, but omitted from FIG. 6.

As shown in FIG. 6. The gated diode 330 of the CMOS device 30 further includes a floating gate 332 formed on the substrate 300 in between the pMOS transistor 310 and the nMOS transistor 320, and a pair of a p-doped region 334 and an n-doped region 336 formed in the substrate 300 and between the pMOS transistor 310 and the nMOS transistor 320. More specific, the p-doped region 334 is formed between the floating gate 332 and the pMOS transistor 310 and the n-doped region 336 is formed between the floating gate 332 and the nMOS transistor 320. Furthermore, a first isolation structure 302 is formed in the substrate 300 between the p-doped region 334 and the pMOS transistor 310, and a second isolation structure 304 is formed in the substrate 300 between the n-doped region 336 and the nMOS transistor 320. Accordingly, the gated diode 330 is formed between the pMOS transistor 310 and the nMOS transistor 320, and spaced apart from the pMOS transistor 310 and the nMOS transistor 320 by the first isolation structure 302 and the second isolation structure 304. Additionally, the pMOS transistor 310 and the nMOS transistor 320 are electrically isolated from other devices by another isolation structures 306 formed in the substrate 300 as shown in FIG. 6.

Please still refer to FIG. 6. The CMOS device 30 further includes a first n-well 340 formed in the substrate 300, and the pMOS transistor 310 is formed in the first n-well 340. Compared with the pMOS transistor 310 which is formed in the first n-well 340, the nMOS transistor 320 is formed in the p-substrate 300 as shown in FIG. 6. More important, the p-doped region 334 of the gated diode 330 is encompassed by the first n-well 340. The CMOS device 30 further includes a second n-well 342 formed in the substrate 300, and the second n-well 342 contacts a bottom of the n-doped region 336 of the gated diode 330, and spaced part from the first n-well 340.

Additionally, a guard ring formed by an n-doped region 350 can be formed around the pMOS transistor 310 except the side where the gated diode 330 is located. Also, a guard ring formed by a p-doped region 352 can be formed around the nMOS transistor 320 except the side where the gated diode 330 is located.

According to the third preferred embodiment, the CMOS device 30 provides a current path and thus the current flow from the p-source/drain 314 of the pMOS transistor 310, the first n-well 340, the p-doped region 334 of the gated diode 330, the first n-well 340, the p-substrate 300, the n-doped region 336 of the gated diode 330, the second n-well 342, the p-substrate 300, to the n-source/drain 324 of the nMOS transistor 320. Accordingly, the current path is formed as: P+ 314/Nwell 340/P+ 334/Nwell 340/PSUB 300/N+ 336-Nwell 342/PSUB 300/N+ 324. In other words, a 8-PN current path, which is formed by the abovementioned 8 adjacent p/n regions, is provided. More important, the holding voltage of the CMOS device 30 is increased to 4V due to the 8-PN current path, and therefore the latch-up immunity is improved.

Figure 7:
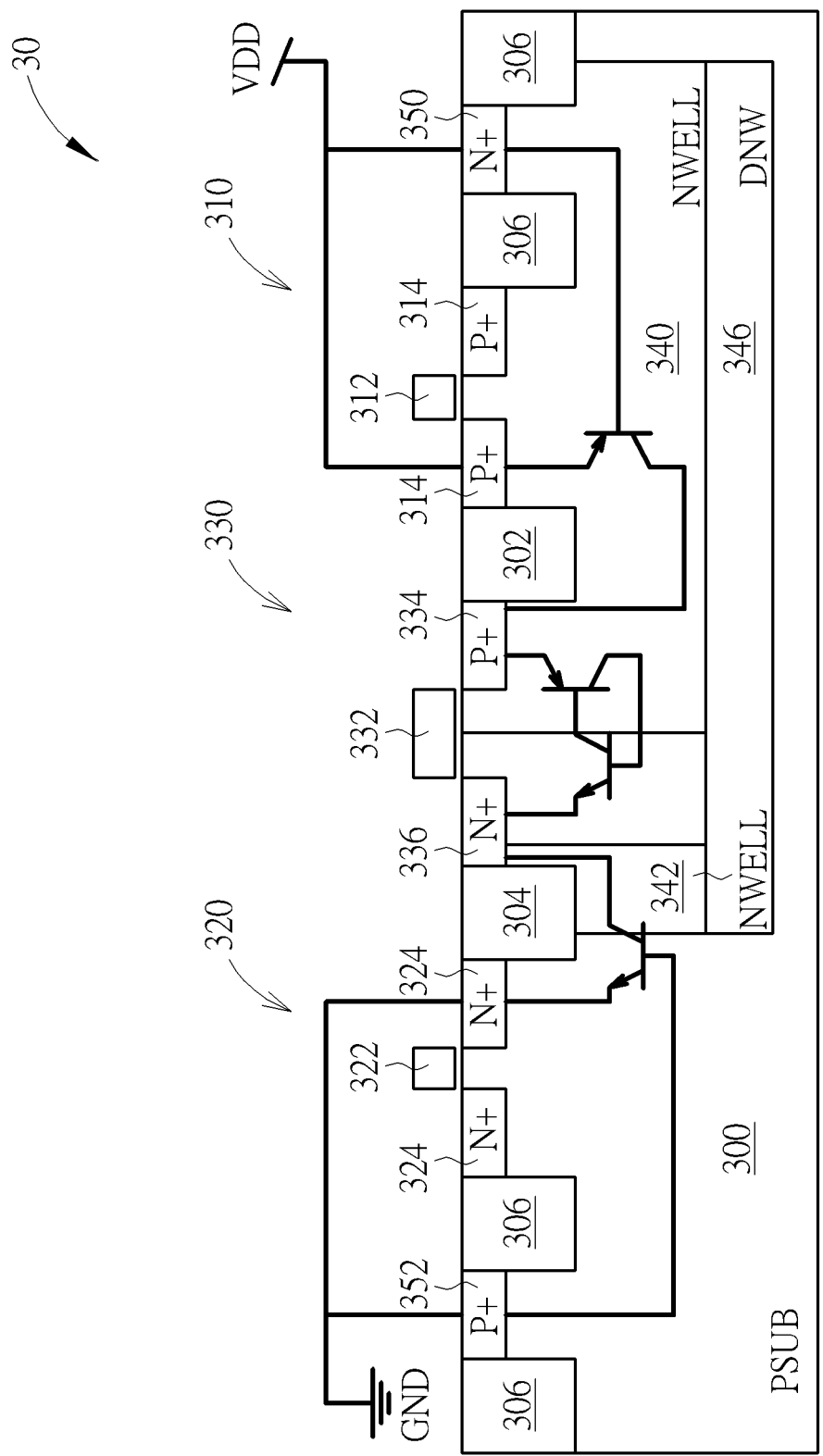
FIG. 7 is a schematic drawing illustrating a modification to the third preferred embodiment.

Please refer to FIG. 7, which is a schematic drawing illustrating a modification to the third preferred embodiment. It is noteworthy that elements the same in the third preferred embodiment and the modification are designated by the same numerals and thus those details are omitted in the interest of brevity. The difference between the third preferred embodiment and the instant modification is: The CMOS device 30 provided by the modification further includes a deep n-well 346 formed in the substrate 300. The deep n-well 346 is a band-like region and contacts a bottom of the first n-well 340 and a bottom of the second n-well 342. Consequently, portions of the p-substrate 300 are encompassed by the deep n-well 346, the first n-well 340, and the second n-well 342. As shown in FIG. 7, the deep n-well 346 is aligned with the first n-well 340 and the second n-well 342. In other words, the deep n-well 346 is constrained in regions where the pMOS transistor 310 and the gated diode 330 are located, and not extended to the region under the nMOS transistor 320.

According to the modifications of the present invention, the deep n-wells 246 is provided as a reinforcement structure. It is observed that current is ensured to pass the 8-PN current path due to the deep n-well 246. And therefore it is ensured that the holding voltage of the CMOS device 30 being increased to 4V and latch-up immunity being improved due to the 8-PN current path.

Figure 8:
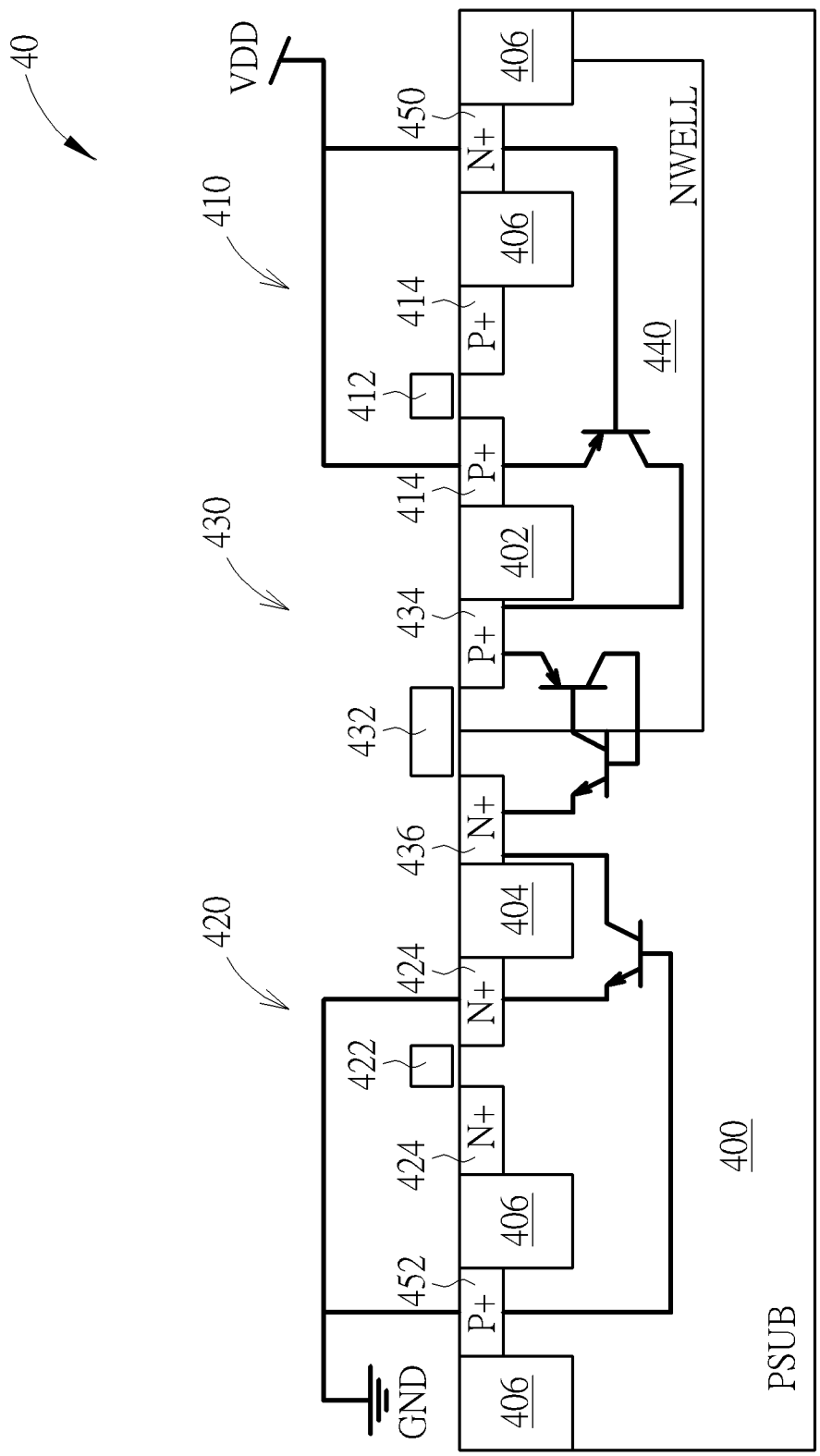
FIG. 8 is a schematic drawing illustrating a cross-sectional view of a CMOS device provided by a fourth preferred embodiment of the present invention.

Please refer to FIG. 8, which is a schematic drawing illustrating a cross-sectional view of a CMOS device provided by a fourth preferred embodiment of the present invention. According to the fourth preferred embodiment, a CMOS device 40 is provided. The CMOS device 40 includes a p-substrate (PSUB) 400. A pMOS transistor 410, an nMOS transistor 420, and a gated diode 430 are formed on the substrate 400. As shown in FIG. 8, the pMOS transistor 410 includes a p-gate 412 and a p-source/drain 414, and the nMOS transistor 420 includes an n-gate 422 and an n-source/drain 424. It should be noted that the pMOS transistor 410 and the nMOS transistor 420 further include LDDs and spacers, but omitted from FIG. 8.

As shown in FIG. 8. The gated diode 430 of the CMOS device 40 further includes a floating gate 432 formed on the substrate 400 in between the pMOS transistor 410 and the nMOS transistor 420, and a pair of a p-doped region 434 and an n-doped region 436 formed in the substrate 400 and between the pMOS transistor 410 and the nMOS transistor 420. More specific, the p-doped region 434 is formed between the floating gate 432 and the pMOS transistor 410, and the n-doped region 436 is formed between the floating gate 432 and the nMOS transistor 420. Furthermore, a first isolation structure 402 is formed in the substrate 400 between the p-doped region 434 and the pMOS transistor 410, and a second isolation structure 404 is formed in the substrate 400 between the n-doped region 436 and the nMOS transistor 420. Accordingly, the gated diode 430 is formed in between the pMOS transistor 410 and the nMOS transistor 420.

Please still refer to FIG. 8. The CMOS device 40 further includes a first n-well 440 formed in the substrate 400, and the pMOS transistor 410 is formed in the first n-well 440. Compared with the pMOS transistor 410 which is formed in the first n-well 440, the nMOS transistor 420 is formed in the p-substrate 400 as shown in FIG. 8. Furthermore, the p-doped region 434 is encompassed in the first n-well 440.

Additionally, a guard ring formed by an n-doped region 450 can be formed around the pMOS transistor 410 except the side where the gated diode 430 is located. Also, a guard ring formed by a p-doped region 452 can be formed around the nMOS transistor 420 except the side where the gated diode 430 is located.

According to the fourth preferred embodiment, the CMOS device 40 provides a current path and thus the current flow from the p-source/drain 414 of the pMOS transistor 410, the first n-well 440, the p-doped region 434 of the gated diode 430, the first n-well 440, the p-substrate 400, the n-doped region 436 of the gated diode 430, the p-substrate 400, to the n-source/drain 424 of the nMOS transistor 420. Accordingly, the current path is formed as: P+ 414/Nwell 440/P+ 434/Nwell 440/PSUB 400/N+ 436/PSUB 400/N+ 424. In other words, a 8-PN current path, which is formed by the abovementioned 8 adjacent p/n regions, is provided. More important, the holding voltage of the CMOS device 40 is increased to 4V due to the 8-PN current path, and therefore the latch-up immunity is improved.

It is noteworthy that the gated diode 130/230/330/430 can be adopted in not only the planar transistor approach but also the non-planar transistor approach. When the planar transistor approach is adopted, the pMOS transistor 110/210/310/410 and the nMOS transistor 120/220/320/420 are planar structures as shown in FIGS. 1-8. In the following description, non-planar transistor approach is provided. In the non-planar transistor approach, the pMOS transistor and the nMOS transistor are Fin field effect transistors (FinFETs).

Figure 9:
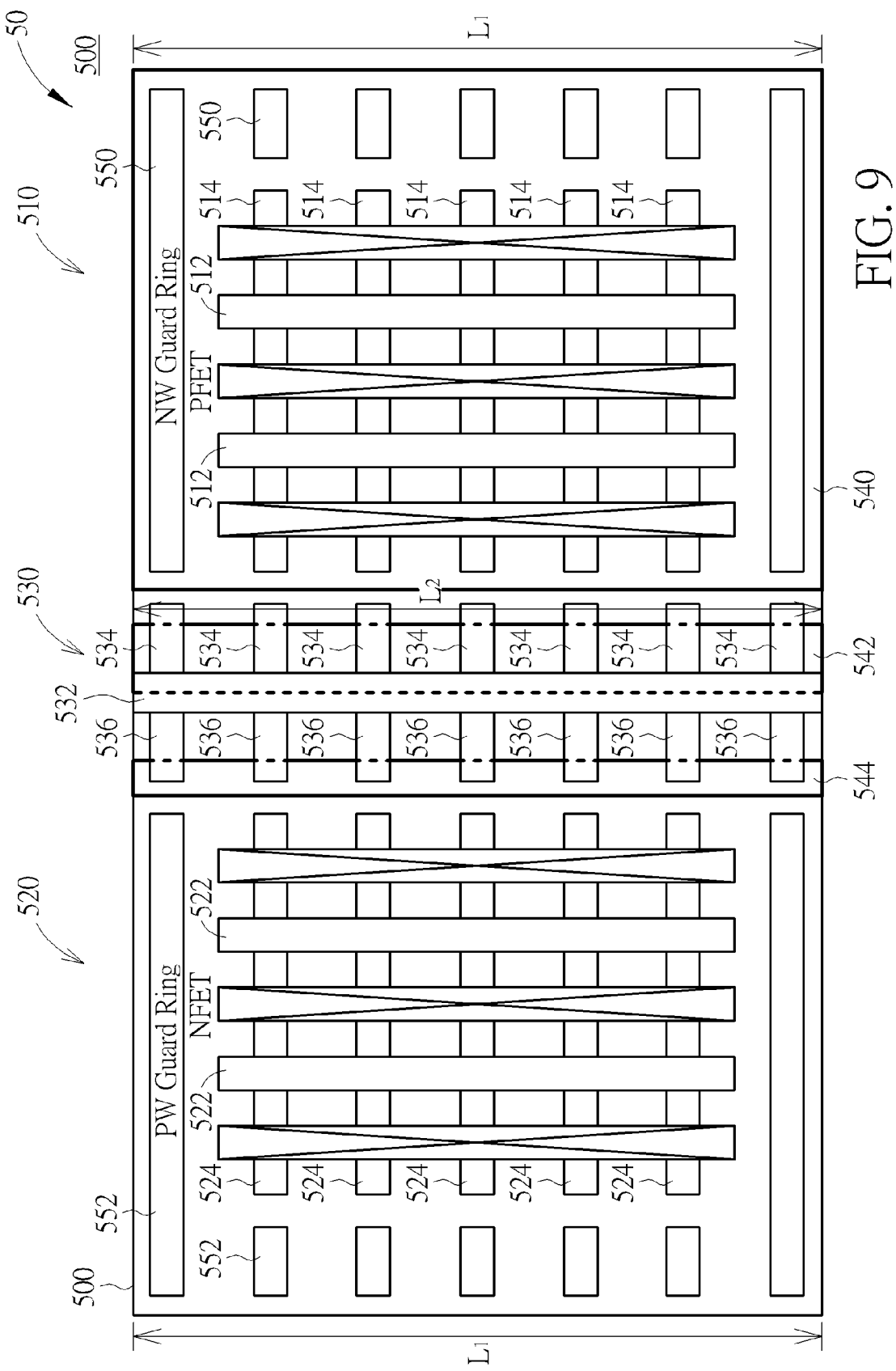
FIG. 9 is a schematic drawing illustrating a layout pattern of f a CMOS device provided by a fifth preferred embodiment of the present invention.

Please refer to FIG. 9, which is a schematic drawing illustrating a layout pattern of f a CMOS device provided by a fifth preferred embodiment of the present invention. As shown in FIG. 9, a CMOS device 50 is provided. The CMOS device 50 includes a p-substrate 500. A p-typed FinFET 510, an n-typed FinFET 520, and a gated diode 530 are formed on the substrate 500. As shown in FIG. 9, the p-typed FinFET 510 includes p-gates 512 and p-sources/drains 514, and the n-typed FinFET 520 includes n-gates 522 and n-sources/drains 524. It should be noted that since the fifth preferred embodiment adopts the non-planar transistor approach, a plurality of fins 514 are formed on the substrate 500, and the p-gates 512 cover portions of the fins 514, which then serve as the p-source/drain 514. In the same concept, a plurality of fins 524 are formed on the substrate 500, and the n-gates 522 cover portions of the fins 524, which then serve as the n-source/drain 524. Additionally, LDDs required by the p-typed FinFET 510 and n-typed FinFET 520 can be respectively formed in the corresponding fins 514 or 524, and spacers can be formed on sidewalls of the p-gates 512 and the n-gates 522. Though the LDDs and the spacers are omitted from FIG. 9, those skilled in the art would easily realize the placement of those elements. Additionally, though there are two p-gates 512 and two n-gates 522 formed on the substrate 500, the amounts of the p-gates 512 and the n-gates 522 are not limited to this. Those skilled in the art would easily realize that amounts of the p-gates 512 and the n-gates 522 can be reduced or increased depending on different requirements.

As shown in FIG. 9. The gated diode 530 of the CMOS device 50 further includes a floating gate 532 formed on the substrate 500 in between the p-typed FinFET 510 and the n-typed FinFET 520, and a plurality of fins are formed on the substrate. The floating gate 532 covers portions of the fins, and doped regions of complementary conductivity types are formed in the fins at respective two sides of the floating gate 532. Consequently, p-doped regions 534 are formed between the floating gate 532 and the p-typed FinFET 510, and the n-doped regions 536 are formed between the floating gate 532 and the n-typed FinFET 520. Furthermore, a first isolation structure (not shown) is formed in the substrate 500 between the p-doped regions 534 and the p-typed FinFET 510, and a second isolation structure (not shown) is formed in the substrate 500 between the n-doped regions 536 and the n-typed FinFET 520. It should be noted that the first and second isolation structures are omitted from FIG. 9 in order to emphasize the spatial relationship between the p-typed FinFET 510, the n-typed FinFET 320, and the gated diode 530. But those skilled in the art would easily realize that a cross-sectional view for illustrating the first isolation structure between the p-doped region 534 and the p-typed FinFET 510, and the second isolation structure between the n-doped region 536 and the n-typed FinFET 520 can be the same with the cross-sectional view shown in FIG. 1. Accordingly, the gated diode 530 is formed between the p-typed FinFET 510 and the n-typed FinFET 520, and spaced apart from the p-typed FinFET 510 and the n-typed FinFET 520 by the first isolation structure and the second isolation structure. Additionally, guard rings formed n-doped fins 550 can be formed around the p-typed FinFET 510 except the side where the gated diode 530 is located. Also, guard rings formed p-doped fins 552 can be formed around the n-typed FinFET 520 except the side where the gated diode 530 is located.

Please still refer to FIG. 9. The CMOS device 50 further includes a first n-well 540 formed in the substrate 500, and the p-typed FinFET 510 is formed in the first n-well 540. Compared with the p-typed FinFET 510 which is formed in the first n-well 540, the n-typed FinFET 520 is formed in the p-substrate 500 as shown in FIG. 9. The CMOS device 50 further includes a second n-well 542 formed in the substrate 500, and the second n-well 542 contacts a bottom and at least a side of the p-doped region 534 and spaced apart from the first n-well 540. The CMOS device 50 further includes a third n-well 544 formed in the substrate 500, and the third n-well 544 contacts a bottom of the n-doped region 536 and spaced apart from the first n-well 540 and from the second n-well 542.

It is easily realized that the arrangements of the first n-well 540, the second n-well 542, and the third n-well 544 are the same with the first preferred embodiment, thus a SCR sandwiched between two BJTs are formed as mentioned afore. And therefore the CMOS device 50 of the preferred embodiment provides a current path as: P+ 514/Nwell 540/PSUB 500-P+ 534/Nwell 542/PSUB 500/N+ 536-Nwell 544/PSUB 500/N+ 524. Accordingly, a 8-PN current path, which is formed by the abovementioned 8 adjacent p/n regions, is provided. And thus the holding voltage of the CMOS device 50 is increased to 4V due to the 8 p/n current path, and therefore the latch-up immunity is improved.

More important, it should be understood that the arrangements for the first n-well 540, the second n-well 542, the third n-well 544, and/or the deep n-well (not shown) can be the same as mentioned in the second, the third, and the fourth preferred embodiments. And a 8 p/n current path is always provided no matter whether the planar or the non-planar approach is adopted.

Furthermore, the p-typed FinFET 510 and the n-typed FinFET 520 respectively include a first length $L_1$, and the gate diode includes a second length $L_2$. And the second length $L_2$ is equal to the first length $L_1$ in the preferred embodiment.

According to the CMOS device 50 provided by the fifth preferred embodiment, the gated diode 530 is adopted in the non-planar transistor approach, and therefore is formed between the p-typed FinFET 510 and the n-typed FinFET 520. It is found that the gated diode 530 successfully replace the conventional donut-shaped guard ring, even the double donut-shaped guard ring, and still provides improved latch-up immunity. More important, the gated diode 530 can be easily integrated with the FinFET fabricating process and the layout area occupied by the gated diode 530 is smaller comparing with the conventional donut-shaped guard ring or double donut-shaped guard ring. Briefly speaking, the gated diode 530 provided by the fifth preferred embodiment improves the latch-up immunity of the CMOS device 50 without consuming so much valuable space in the ICs.

Figure 10:
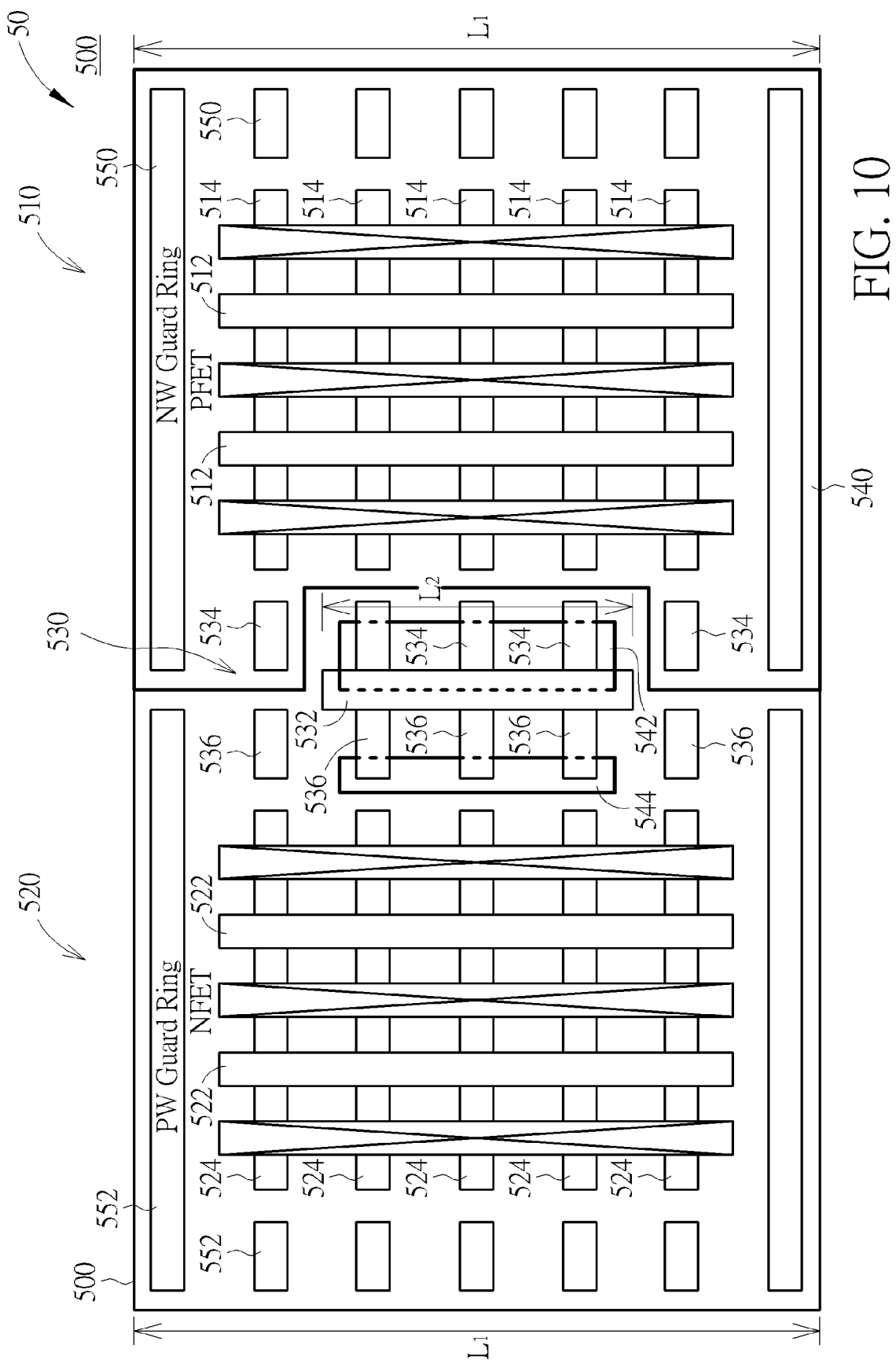
FIG. 10 is a schematic drawing illustrating a layout pattern of f a CMOS device provided by a sixth preferred embodiment of the present invention.

Please refer to FIG. 10, which is a schematic drawing illustrating a layout pattern of a CMOS device provided by a sixth preferred embodiment of the present invention. It is noteworthy that elements the same in the fifth and the sixth preferred embodiments are designated by the same numerals and thus those details are omitted in the interest of brevity. The difference between the fifth and the sixth preferred embodiments is: the second length $L_2$ of the gated diode 530 is smaller than the first length $L_1$ of the p-typed FinFET 510 and the n-typed FinFET 520.

As shown in FIG. 10, the p-typed FinFET 510 is surrounded by a guard ring, which is formed by the n-doped fins 550, except the particular portion where the gated diode 530 is located. Also, a guard ring formed by p-doped fins 552 can be formed around the n-typed FinFET 520 except the particular portion where the gated diode 530 is located.

It is found that the gated diode 530 and the n-wells formed in the substrate 500 increases holding voltage sufficient to improve latch-up immunity even the gated diode 530a is smaller than the p-typed FinFET 510 and the n-typed FinFET 520, and thus the layout area occupied by the gated diode 530 can be further reduced.

According to the CMOS device provided by the present invention, a gated diode and at least an n-well are provided to separate the pMOS transistor and the nMOS transistor. More important, the gated diode and the n-well (s) are provided to increase the holding voltage of the CMOS device by adding p/n junctions between the pMOS transistor and the nMOS transistor. Briefly speaking, the CMOS device provided by the present invention improves latch-up immunity without increasing layout area. More important, the gated diode and n-well(s) are easily integrated in planar or non-planar transistor approaches and are provided to improve latch-up immunity without consuming so much valuable space in the ICs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary metal-oxide-semiconductor (CMOS) device, comprising:
   a substrate;
   a pMOS transistor and an nMOS transistor formed on the substrate; and
   a gated diode comprising:
   a floating gate formed on the substrate in between the pMOS transistor and the nMOS transistor; and a p-doped region and an n-doped region formed in the substrate and between the pMOS transistor and the nMOS transistor, the n-doped region being formed between the floating gate and the nMOS transistor and the p-doped region being formed between the floating gate and the pMOS transistor, wherein the p-doped region and the n-doped region are formed on respective two sides of floating gate and immediately adjacent to the floating gate.

2. The CMOS device according to claim 1, further comprising a first isolation structure formed in the substrate between the p-doped region and the pMOS transistor, and a second isolation structure formed in the substrate between the n-doped region and the nMOS transistor.

3. The CMOS device according to claim 1, further comprising a first n-well formed in the substrate, and the pMOS transistor is formed in the first n-well.

4. The CMOS device according to claim 3, wherein the p-doped region is encompassed in the first n-well.

5. The CMOS device according to claim 4, further comprising a second n-well formed in the substrate, the second n-well contacts a bottom of the n-doped region and spaced part from the first n-well.

6. The CMOS device according to claim 5, further comprising a deep n-well formed in the substrate, the deep n-well contacts a bottom of the first n-well and a bottom of the second n-well.

7. The CMOS device according to claim 3, further comprising a second n-well formed in the substrate, the second n-well contacts a bottom and at least a side of the p-doped region and spaced apart from the first n-well.

8. The CMOS device according to claim 7, further comprising a deep n-well formed in the substrate, the deep n-well contacts a bottom of the first n-well and a bottom of the second n-well.

9. The CMOS device according to claim 7, further comprising a third n-well formed in the substrate, the third n-well contacts a bottom of the n-doped region and spaced apart from the first n-well and from the second n-well.

10. The CMOS device according to claim 9, further comprising a deep n-well formed in the substrate, the deep n-well contacts a bottom of the first n-well, a bottom of the second n-well, and a bottom of the third n-well.

11. The CMOS device according to claim 10, wherein the deep n-well is aligned with the first n-well and the third n-well.

12. The CMOS device according to claim 1, wherein the pMOS transistor and the nMOS transistor are planar structures.

13. The CMOS device according to claim 1, wherein the pMOS transistor is p-typed Fin field effect transistors (FinFETs) and the nMOS transistor is a n-typed FinFET.

14. The CMOS device according to claim 13, wherein the p-typed FinFET and the n-typed FinFET respectively comprise a first length, and the gate diode comprises a second length.

15. The MOS device according to claim 14, wherein the second length is equal to the first length.

16. The MOS device according to claim 14, wherein the second length is smaller than the first length.

* * * * *